US006628175B1

(12) United States Patent
Guo et al.

(10) Patent No.: US 6,628,175 B1
(45) Date of Patent: Sep. 30, 2003

(54) VOLTAGE-CONTROLLED CRYSTAL OSCILLATOR (VCXO) USING MOS VARACTORS COUPLED TO AN ADJUSTABLE FREQUENCY-TUNING VOLTAGE

(75) Inventors: Zhangqi Guo, San Jose, CA (US); Hide Hattori, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/063,167

(22) Filed: Mar. 27, 2002

(51) Int. Cl.[7] .................................................. H03B 5/32
(52) U.S. Cl. .................. 331/158; 331/109; 331/116 FE
(58) Field of Search .............................. 331/177 R, 181, 331/177 V, 158, 160, 108 R, 116 FE, 109

(56) References Cited

U.S. PATENT DOCUMENTS

| 3,911,378 | A | 10/1975 | Buchanan | 331/116 |
|---|---|---|---|---|
| 4,179,671 | A | 12/1979 | Yoshida et al. | 331/116 |
| 4,571,558 | A | 2/1986 | Gay et al. | 331/105 |
| 4,814,640 | A | 3/1989 | Miyake | 327/564 |
| 4,827,226 | A | 5/1989 | Connell | 331/116 |
| 5,030,926 | A | 7/1991 | Walden | 331/116 |
| 5,185,585 | A | 2/1993 | Newell et al. | 331/46 |
| 5,254,958 | A | 10/1993 | Flach et al. | 331/10 |
| 5,534,819 | A | 7/1996 | Gunter et al. | 327/553 |
| 5,764,112 | A | 6/1998 | Bal et al. | 331/116 |
| 5,805,029 | A | 9/1998 | Theus et al. | 331/116 |
| 5,999,062 | A | * 12/1999 | Gilbert | 331/116 R |
| 6,034,446 | A | 3/2000 | Kowalski et al. | 307/112 |
| 6,040,744 | A | * 3/2000 | Sakurai et al. | 331/176 |
| 6,052,036 | A | 4/2000 | Enstrom et al. | 331/176 |
| 6,058,294 | A | 5/2000 | Bruwer et al. | 455/119 |
| 6,169,460 | B1 | 1/2001 | Wordelman | 331/116 |
| 6,268,776 | B1 | 7/2001 | Faison et al. | 331/116 |
| 6,268,778 | B1 | 7/2001 | Mucke et al. | 331/117 |
| 6,285,264 | B1 | * 9/2001 | Mann | 331/158 |

* cited by examiner

*Primary Examiner*—Minh Nguyen
(74) *Attorney, Agent, or Firm*—Stuart T. Auvinen (57) ABSTRACT

A voltage-controlled crystal oscillator (VCXO) has variable load capacitors on the crystal nodes. The variable load capacitors are p-channel or n-channel transistors with their source and drain nodes connected to a crystal node. The gates are driven by an input voltage that is generated from a full-swing control voltage by a voltage conversion circuit. The input voltage has a half-swing of only half of the power-supply voltage, or VDD/2. The input voltage driving n-channel capacitors swings from VDD to VDD/2, which is just above the source voltage of VDD/2 on the crystal node and ensures that the n-channel capacitors remain on for most of the range. A series of resistors can divide the input voltage into a series of differing voltages that drive gates of multiple n-channel capacitors that have their source/drains connected in parallel to the crystal node. Capacitance increases as an n-channel capacitor channel turns on.

16 Claims, 7 Drawing Sheets

FIG. 1

PRIOR ART

FIG. 2

PRIOR ART

VOLTAGE-CONTROLLED CRYSTAL OSCILLATOR (VCXO) USING MOS VARACTORS COUPLED TO AN ADJUSTABLE FREQUENCY-TUNING VOLTAGE

BACKGROUND OF INVENTION

This invention relates to voltage-controlled crystal oscillators (VCXO), and more particularly to voltage-controlled capacitors for VCXO's.

Many digital systems rely on precise clocks to sequence through states and process data. Crystal oscillators are often used to generate the precise clocks needed by these systems. A voltage-controlled crystal oscillator (VCXO) is often used.

Figure 1:
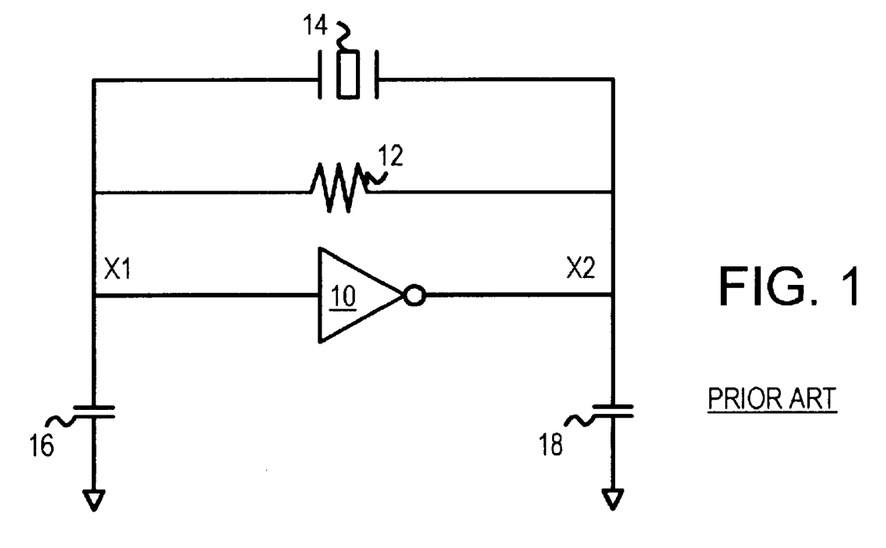
FIG. 1 is a diagram of a prior-art crystal oscillator.

FIG. 1 is a diagram of a prior-art crystal oscillator. Crystal 14 oscillates at a fundamental frequency when a gain stage provides gain to start the crystal oscillating and then to maintain the oscillation. Crystal 14 is coupled between nodes X1 and X2, and is usually connected to other components such as inverter 10 by pins on an integrated circuit (IC). Inverter 10 inverts node X1 and drives node X2, acting as the gain stage. Feedback resistor 12 acts as a DC bias that biases inverter 10 in its gain region.

Capacitors 16, 18 provide a load capacitance to ground for nodes X1, X2. The value of capacitors 16, 18 can alter the frequency of oscillation of crystal 14. Any given crystal has a manufacturer-specified load capacitance that causes the crystal to oscillate at exactly the specified frequency. Larger capacitive loads on nodes X1, X2 slow down the oscillation, while smaller capacitive loads on nodes X1, X2 accelerate the oscillation. Values of 20–40 pF are common for capacitors 16, 18.

Sometimes it is desirable to alter or tune the frequency of oscillation. A control voltage can be applied to adjust the oscillator frequency. A VCXO consists of a conventional crystal oscillator that is tuned by an externally applied voltage. The tuning voltage changes the frequency of oscillation. A crystal oscillation frequency is determined primarily by physical dimensions and process. Most VCXO's have a very high quality factor (Q), which implies that the frequency of oscillation is very tightly controlled and varies only a few hundred parts per million (ppm). The narrow pull range is an important advantage in telecom systems, HDTV, and other application areas.

Figure 2:
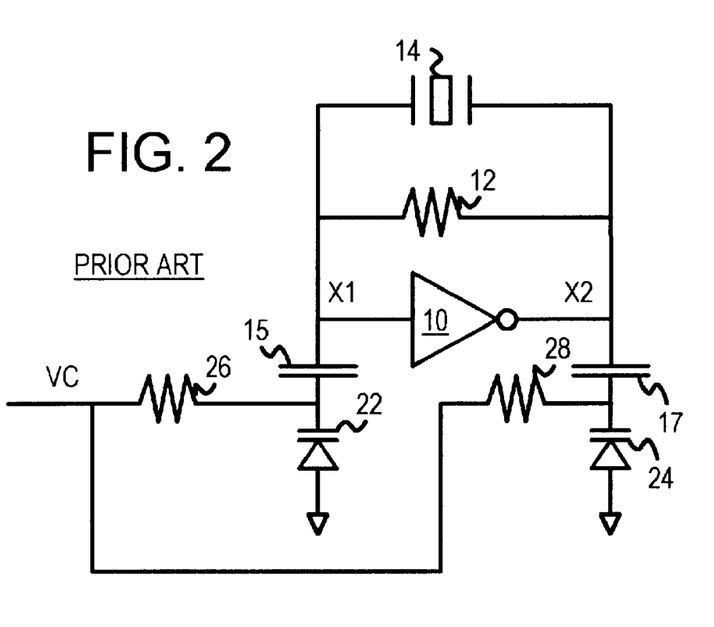
FIG. 2 shows a voltage-controlled crystal oscillator (VCXO).

FIG. 2 shows a voltage-controlled crystal oscillator (VCXO). Feedback resistor 12 and inverter 10 are coupled across nodes X1, X2 of crystal 14.

The capacitance of nodes X1, X2 is set by DC isolation capacitors 15, 17. These are much larger capacitors than in FIG. 1, being perhaps 200 pF. Larger capacitor values are needed since two capacitors 15, 22 are in series. The equivalent capacitance of two series capacitors 15, 22 is the reciprocal of the sum of the reciprocals of the two capacitances, $C_{series}=1/(1/C_{15}+1/C_{22})$.

A control voltage Vc is applied to the back of DC isolation capacitor 15 through resistor 26, and to the back of DC isolation capacitor 17 through resistor 28. This control voltage Vc can range from ground to the power-supply voltage VDD. The DC voltage of nodes X1, X2 is about VDD/2, set by feedback resistor 12, which connects the input and output of inverter 10. DC offset capacitors 15, 17 isolate nodes X1, X2 from the control voltage Vc.

Diode varactor capacitors 22, 24 are also coupled to the backsides of DC isolation capacitors 15, 17. Control voltage Vc can change the capacitance value of diode varactor capacitors 22, 24. The equivalent series capacitance of capacitors 15, 22 or 17, 24 also changes, changing the capacitive load on nodes X1, X2. This varies the loading capacitance and oscillation frequency of the VCXO. Unfortunately, diode varactors are not available in standard CMOS process, but are expensive components produced by a special manufacturing process.

The control voltage Vc can be increased, causing the diode varactor capacitance of capacitors 22, 24 to decrease, and the crystal oscillation frequency to increase. Otherwise when Vc decreases, the diode capacitance of capacitors 22, 24 increases, so the crystal oscillation frequency decreases. Thus the frequency of oscillation can be adjusted by adjusting the control voltage Vc.

Additional inverters (not shown) can be driven by node X2. These additional inverters can then drive clock buffers that drive clocks to various destinations.

While such a voltage-controlled oscillator is useful, the size of DC isolation capacitors 15, 17 is quite large. The diode varactor's capacitive-coupling ratio is reduced by parasitic capacitances of the large DC isolation capacitors, reducing circuit efficiency. The large size of the DC isolation capacitors make it more expensive to integrate them onto the same silicon chip as inverter 10 and other system components. Instead, external DC isolation capacitors and diode varactors are sometimes used, either on-chip of off-chip.

What is desired is a voltage-controlled crystal oscillator without the large DC isolation capacitors. Smaller capacitors that can be integrated onto the same system chip as the oscillator's feedback inverter are desired. A VCXO with integrated capacitors that adjust the oscillator frequency in response to a control voltage is desired.

A voltage-controlled crystal oscillator (VCXO) has a crystal that is coupled between a first node and a second node. The crystal oscillates at an oscillation frequency when connected to a gain inverter. The gain inverter has an input driven by the first node. The gain inverter drives the second node to induce oscillation by the crystal. A feedback resistor is coupled between the first and second nodes.

A first metaloxide-semiconductor (MOS) capacitor has a source/drain coupled to the first node and a gate coupled to a first gate node. The first MOS capacitor has a capacitance that varies with a first input voltage of the first gate node. A second MOS capacitor has a source/drain coupled to the second node and a gate coupled to a second gate node. The second MOS capacitor has a capacitance that varies with a second input voltage of the second gate node.

The first and second gate nodes are connected together and driven by an input voltage. The oscillation frequency and capacitances of the first and second MOS capacitors vary when the input voltage varies. Thus variations in the input voltage vary the oscillation frequency by adjusting capacitances of the first and second MOS capacitors.

DETAILED DESCRIPTION

The present invention relates to an improvement in voltage-controlled crystal oscillators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
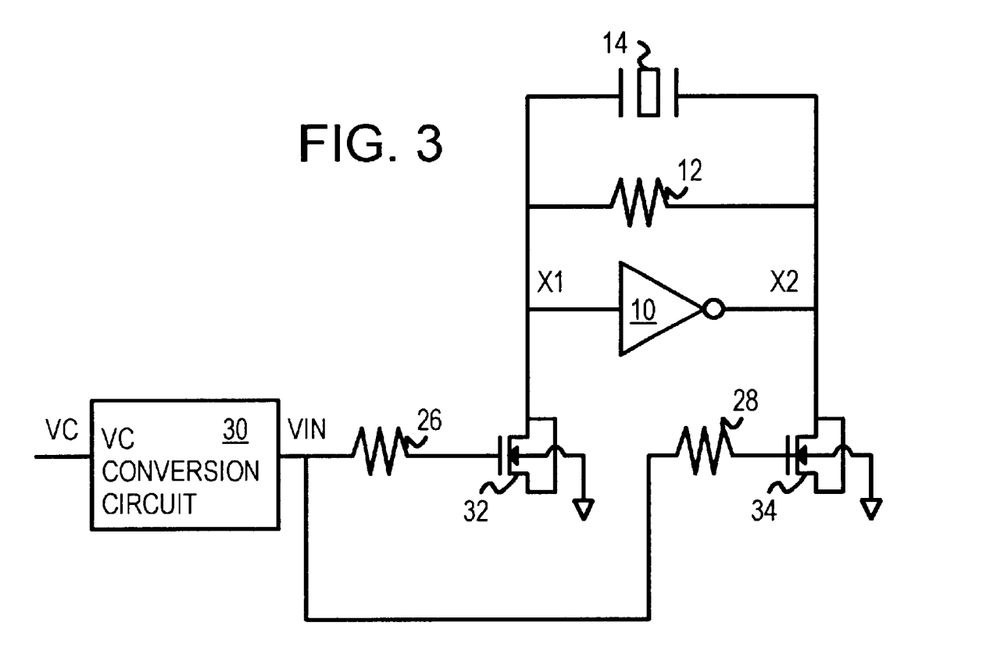
FIG. 3 is a diagram of a VCXO with n-channel transistors as load capacitors.

FIG. 3 is a diagram of a VCXO with n-channel transistors as load capacitors. Crystal 14 can be external to an integrated circuit chip that contains the other components, including inverter 10, feedback resistor 12, and n-channel capacitors 32, 34. The source and drain nodes of n-channel capacitor 32 are connected together and to node X1, while the gate of n-channel capacitor 32 is driven through resistor 26 by input voltage Vin. Input voltage Vin is generated by conversion circuit 30 from control voltage Vc.

Likewise, the source and drain nodes of n-channel capacitor 34 are connected together and to node X2, while the gate of n-channel capacitor 34 is driven through resistor 28 by input voltage Vin. Since capacitors 32, 34 are constructed from n-channel transistors, they can easily be integrated with other devices, such as inverter 10 and conversion circuit 30, perhaps as part of a larger system chip.

The substrates of n-channel capacitors 32, 34 are connected to ground. The source-to-substrate and drain-to-substrate junctions act as diode varactor capacitors to ground. Additionally, the channel or gate capacitance acts as a capacitor to input voltage Vin when the transistor channel forms.

The capacitance of n-channel capacitors 32, 34 varies with the voltage difference from gate to source/drain. When Vin is lower than the voltage on X1, no channel is formed under the gate of capacitor 32, and the capacitance is limited to the junction capacitance of the source and drain (depletion). As Vin rises to a transistor-threshold voltage above X1, the channel is formed under the gate, and capacitance rises due to the inversion channel charge under the gate (weak inversion). As the input voltage Vin continues to rise, the larger gate-to-source voltage increases the amount of charge in the channel under the gate, and capacitance increases further (strong inversion).

The capacitance of n-channel capacitors 32, 34 thus increases as input voltage Vin rises. The higher capacitances loading nodes X1, X2 slow down the oscillation, reducing the oscillator frequency. Thus increasing Vin reduces frequency.

The VCXO has a nominal frequency and can be varied or pulled about +/−150 ppm by varying control voltage Vc. However, the control voltage Vc varies in the opposite direction as input voltage Vin. Control voltage Vc also varies over a wider range of voltages than does Vin. Vc conversion circuit 30 is used to adjust and reverse Vc to generate the desired input voltage Vin.

Figure 4:
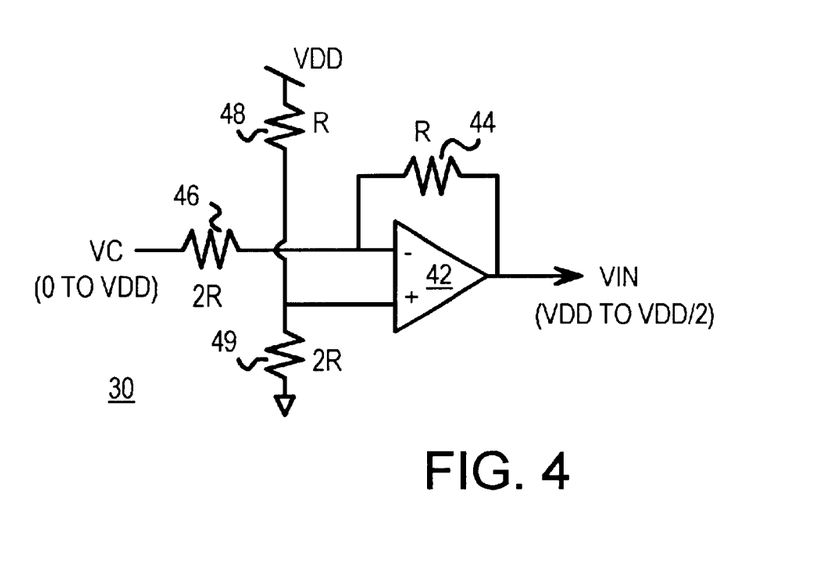
FIG. 4 is a diagram of the control-voltage conversion circuit of FIG. 3.

FIG. 4 is a diagram of the control-voltage conversion circuit of FIG. 3. Conversion circuit 30 converts control voltage Vc into input voltage Vin that is applied to the gates of the n-channel capacitors that adjust the oscillation frequency.

Control voltage Vc is an input voltage to the VCXO circuit, generated by the system. Control voltage Vc swings within the full range of ground to the power-supply voltage VDD. Increases in control voltage Vc are intended to increase the frequency of oscillation.

Control voltage Vc is applied to the inverting (−) input of op amp 42 through resistor 46. A reference voltage is applied to the non-inverting (+) input of op amp 42. This reference voltage is generated by resistors 48, 49, which act as a voltage divider between power and ground. In this example, pull-up resistor 48 has half the resistance value of pull-down resistor 49, so the reference voltage generated between resistors 48, 49 is ⅔'s of VDD, about 2 volt for a 3-volt VDD.

Feedback resistor 44 is coupled between the output and inverting input of op amp 42. The resistor values produce an inverter amplifier circuit with a gain (Av) of −½.

As Vc rises above ⅔ VDD, op amp 42 drives Vin lower. When Vc is VDD, Vin is Vdd/2. As Vc falls below ⅔ VDD to ground, op amp 42 drives Vin higher. When Vc is 0 volt, Vin is Vdd. Thus voltage changes to the control voltage Vc are inverted by op amp 42 to generate Vin.

The full swing of Vc from ground to VDD is reduced to the half-range swing of Vin, which ranges from VDD to VDD/2. The upper voltage range of Vin is useful for driving the gate of n-channel capacitors 32, 34, since the n-type channel does not form for low voltages. Since node X1 is near VDD/2, the channel forms and capacitance increases as Vin rises above VDD/2+Vtn, the n-channel transistor threshold.

Figure 5:
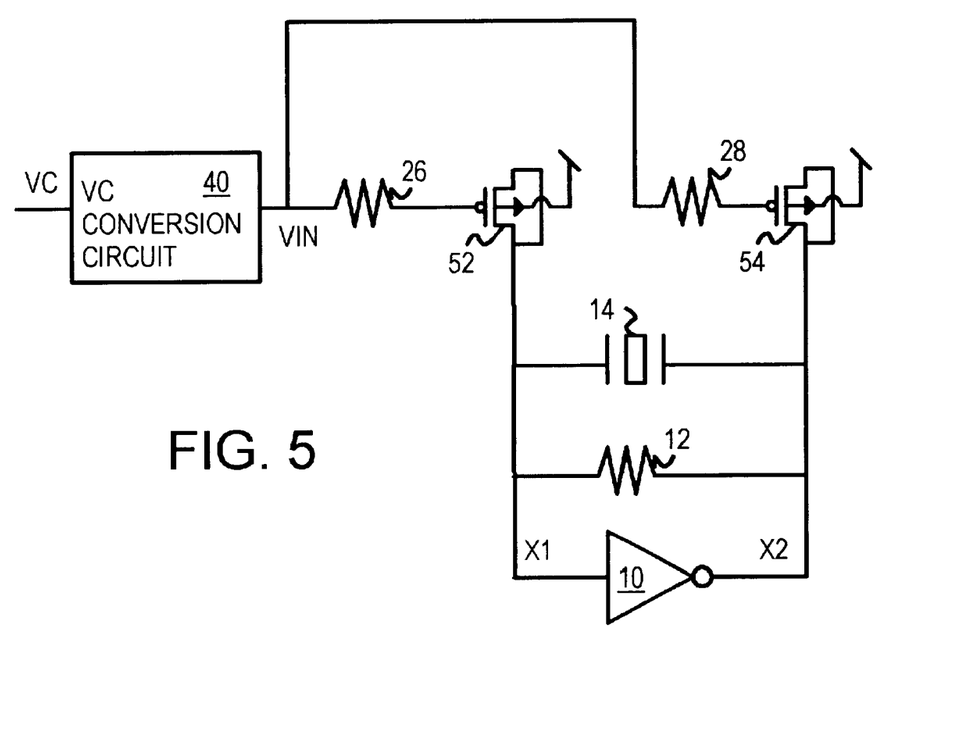
FIG. 5 is a diagram of a VCXO with p-channel transistors as load capacitors.

FIG. 5 is a diagram of a VCXO with p-channel transistors as load capacitors. Rather than use n-channel transistors, p-channel transistors are used for load capacitors. This allows for input voltage Vin to swing in the same direction as control voltage Vc, simplifying the control-voltage conversion circuit.

Crystal 14 oscillates when driven by inverter 10, which acts as a gain stage biased to VDD/2 by feedback resistor 12. A variable load capacitance is applied to nodes X1, X2 by p-channel capacitors 52, 54. The source and drain nodes of p-channel capacitor 52 are connected together and to node X1, while the gate of p-channel capacitor 52 is driven through resistor 26 by input voltage Vin. Input voltage Vin is generated by conversion circuit 40 from control voltage Vc.

Likewise, the source and drain nodes of p-channel capacitor 54 are connected together and to node X2, while the gate of p-channel capacitor 54 is driven through resistor 28 by input voltage Vin. Since capacitors 52, 54 are constructed from p-channel transistors, they can easily be integrated with other devices, such as inverter 10 and conversion circuit 40, perhaps as part of a larger system chip.

The substrates of p-channel capacitors 52, 54 are N-wells that are connected to the VDD power supply. The source-to-substrate and drain-to-substrate junctions act as diode varactor capacitors to a constant VDD. Additionally, the channel or gate capacitance acts as a capacitor to input voltage Vin when the transistor channel forms.

The capacitance of p-channel capacitors 52, 54 varies with the voltage difference from gate to source/drain. When Vin is higher than the voltage on X1, no channel is formed under the gate of capacitor 52, and the capacitance is limited to the junction capacitance of the source and drain (depletion). As Vin drops to a transistor-threshold voltage below X1, the channel is formed under the gate, and capacitance rises due to the inversion channel charge under the gate (weak inversion). As the input voltage Vin continues to fall, the larger gate-to-source voltage increases the amount of charge in the channel under the gate, and capacitance increases further (strong inversion).

The capacitance of p-channel capacitors 52, 54 thus increases as input voltage Vin falls. The higher capacitances loading nodes X1, X2 slow down the oscillation, reducing the oscillator frequency. Thus decreasing Vin reduces frequency.

Using p-channel capacitors has the advantage that the control voltage Vc varies in, the same direction as input voltage Vin. However, control voltage Vc still varies over a wider range of voltages than does Vin. Vc conversion circuit 40 is used to adjust Vc to generate the desired input voltage range for Vin.

Figure 6:
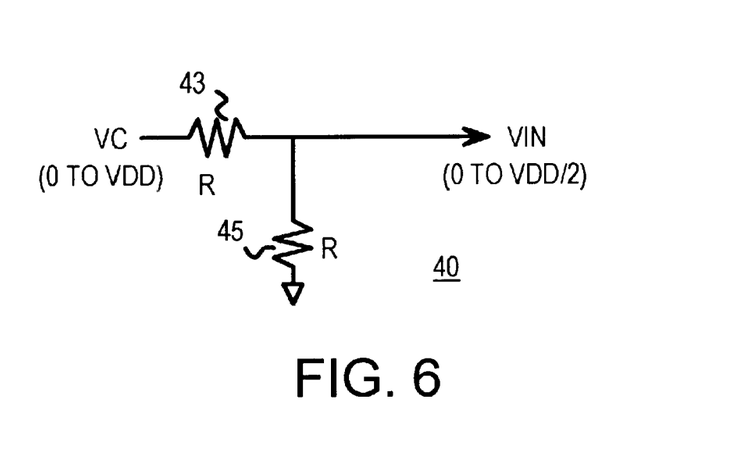
FIG. 6 is a diagram of the control-voltage conversion circuit of FIG. 5.

FIG. 6 is a diagram of the control-voltage conversion circuit of FIG. 5. Conversion circuit 40 converts control voltage Vc into input voltage Vin that is applied to the gates of the p-channel capacitors that adjust the oscillation frequency.

Control voltage Vc is an input voltage to the VCXO circuit, generated by the system. Control voltage Vc swings within the full range of ground to the power-supply voltage VDD. Increases in control voltage Vc are intended to increase the frequency of oscillation. Since Vc and Vin vary in the same direction, a simple voltage divider circuit can be used to reduce the voltage range of Vc.

Resistors 43, 45 form a voltage divider between control voltage Vc and ground. Since both resistors 43, 45 have the same resistance value R, the voltage between resistors 43, 45 is half of control voltage Vc. This intermediate node is used to output input voltage Vin to the p-channel capacitors. Since control voltage Vc has a range of 0 to VDD, input voltage Vin has a range of 0 to VDD/2. These lower voltages are ideal for driving the gates of p-channel capacitors, since the channel is formed over most of this voltage range. No p-type channel is formed for the upper voltage range VDD/2 to VDD, so not using this voltage range is advantageous.

Figure 7:
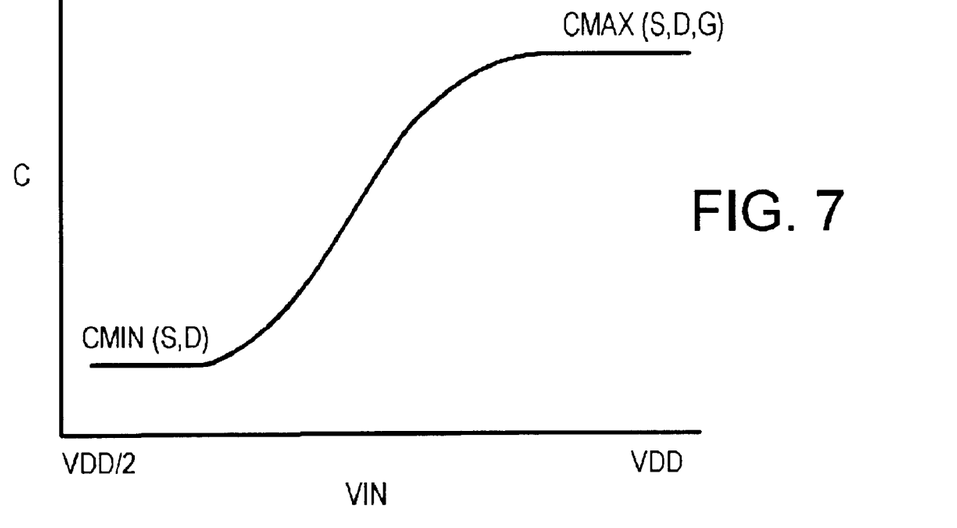
FIG. 7 is a plot of capacitance of the n-channel capacitor of FIG. 3.

FIG. 7 is a plot of capacitance of the n-channel capacitor of FIG. 3 as a function of the input voltage Vin. When Vin is at the low end of its range, near VDD/2, the gate to source/drain voltage is near zero, since the DC voltage of nodes X1, X2 stays near VDD/2. The channel is turned off, and capacitance is mainly the source and drain junction capacitances, which are depletion junctions.

As Vin falls by about the transistor threshold voltage, the channel inverts and capacitance increases. As the Vin falls further, the gate voltage rises more, attracting more charge to the channel under the gate. A strongly-inverted channel is formed, increasing capacitance. The maximum capacitance is reached once this channel is fully formed. Thus capacitance increases with input voltage Vin.

Figure 8:
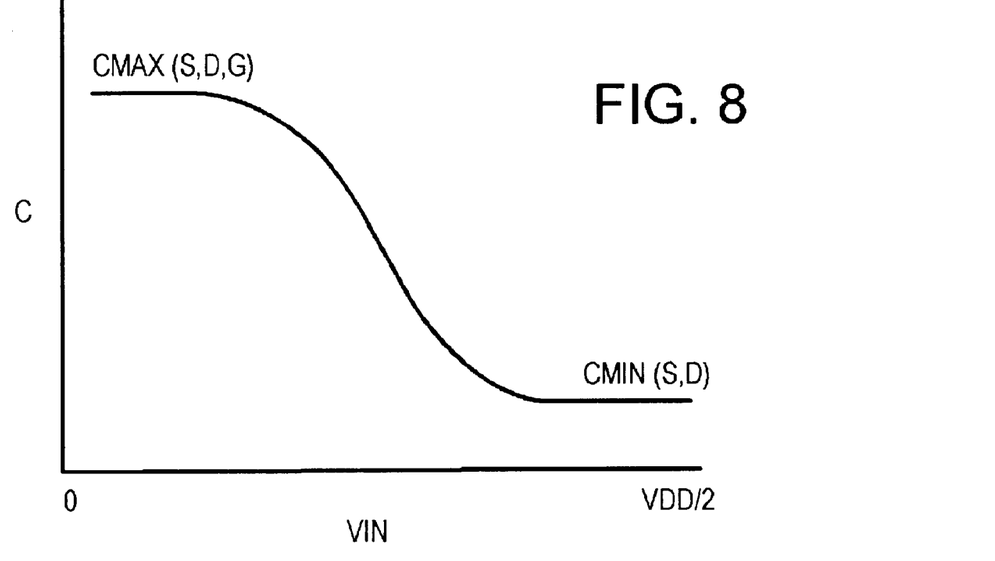
FIG. 8 is a plot of capacitance of the p-channel capacitor of FIG. 5.

FIG. 8 is a plot of capacitance of the p-channel capacitor of FIG. 5 as a function of the input voltage Vin. When Vin is at the high end of its range, near VDD/2, the gate to source/drain voltage is near zero, since the DC voltage of nodes X1, X2 stays near VDD/2. The p-type channel is turned off, and capacitance is mainly the source and drain junction capacitances, which are depletion junctions.

As Vin falls by about the transistor threshold voltage, the channel inverts and capacitance increases. As the Vin falls further, the absolute value of the gate-to-source voltage increases, attracting more charge to the channel under the gate. A strongly-inverted channel is formed, increasing capacitance. The maximum capacitance is reached once this channel is fully formed. The capacitance stays near the maximum as the input voltage Vin falls to ground. Thus capacitance increases with decreasing input voltage Vin.

A disadvantage of the embodiments previously shown is that the capacitance of the n-channel or p-channel capacitors changes abruptly as the channel turns on, as shown in FIGS. 7, 8. A small change in input voltage Vin produces a sharp, fast change in capacitance. A more gradual increase in capacitance is desirable.

Figure 9:
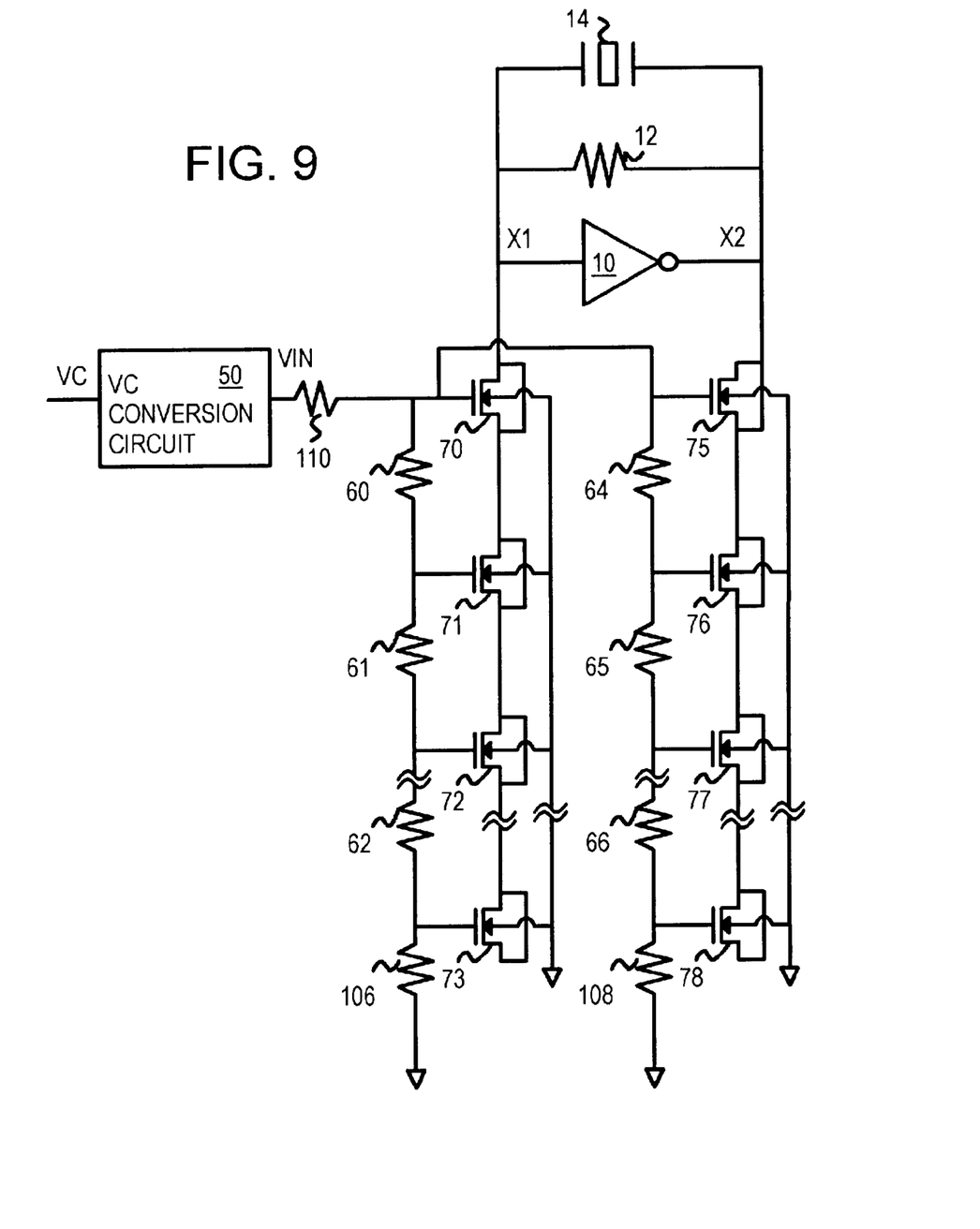
FIG. 9 is a diagram of a VCXO that uses multiple n-channel capacitors in parallel that form channels at different values of the input voltage.

FIG. 9 is a diagram of a VCXO that uses multiple n-channel capacitors in parallel that form channels at different values of the input voltage. Rather than attach just one n-channel capacitor to each node X1, X2, multiple n-channel capacitors are attached. Each n-channel capacitor receives a slightly different gate voltage, so each initially forms a channel at a different time. Thus capacitance changes due to channel turn on is spread among many values of the input voltage Vin. This reduces the abrupt slope of the capacitance-voltage curve, improving linearity.

Crystal 14 oscillates in response to gain inverter 10 connected across nodes X1, X2. Feedback resistor 12 keeps nodes X1, X2 near VDD/2. The oscillation frequency varies as the load capacitance changes. The load capacitance on node X1 is the sum of parallel capacitances of n-channel capacitors 70–73. The load capacitance on node X2 is the sum of parallel capacitances of n-channel capacitors 75–78. The number of n-channel capacitors can be increased to increase linearity.

The source and drain nodes of n-channel capacitors 70–73 are connected together and to node X1, so that all n-channel capacitors 70–73 are connected in parallel to node X1. However the gates of n-channel capacitors 70–73 are separate, allowing the gates to be driven by different gate voltages.

Likewise, the source and drain nodes of n-channel capacitors 75–78 are connected together and to node X2, so that all n-channel capacitors 75–78 are connected in parallel to node X2. However the gates of n-channel capacitors 75–78 are separate, allowing the gates to also be driven by different gate voltages. In normal operation, some of n-channel capacitors 70–73 and 75–78 are turned on, having increased capacitance, while others are turned off, having lower capacitance.

Control-voltage conversion circuit 50 converts control voltage Vc to generate input voltage Vin. The range of Vc is 0 to VDD, which is converted to a reduced and inverted range of VDD to VDD/2 for Vin.

Multiple gate voltages are generated from Vin by a series of resistors between Vin and ground. Input voltage Vin is reduced slightly by input resistor 110 to generate the gate voltage for n-channel capacitors 70, 75. The gate voltage is reduced further by resistors 60, 64 to produce the somewhat lower gate voltages for n-channel capacitors 71, 76. Resistors 61, 65 further lower the gate voltage to produce still lower gate voltages for n-channel capacitors 72, 77. Other resistors (not shown) drive other gates of n-channel capacitors (not shown) before resistors 62, 66 generate the lowest gate voltage, which is applied to the gates of n-channel capacitors 73, 78.

Each gate is driven with successively lower voltages, but all n-channel capacitors have the same source/drain voltage. Those n-channel capacitors that have gate voltages more than a transistor threshold voltage above the source voltage (X1 or X2) have a channel formed and have a higher capacitance. Those n-channel capacitors with gate voltages below the source voltage are turned off and have a lower capacitance of the source and drain junctions but without gate-channel capacitance.

As the input voltage is raised, each gate voltage rises too. When a n-channel capacitor has a gate voltage slightly below a threshold above its source, and Vin rises causing the gate voltage to rise above a threshold above the source voltage, the capacitance of that n-channel capacitor increases significantly as the channel forms. However, the capacitance of other n-channel capacitors does not change as significantly, since their channels remain on or off. Thus capacitance changes only slightly as one capacitor turns on at a time.

Tail resistors 106, 108 connect the final gates to ground. Tail resistors 106, 108 can have a larger resistance value than other resistors 60, 61, 62, 64, 65, 66 to keep the final gate voltage above the transistor threshold voltage for most values of Vin. For example, resistor 106 can have a large resistance value to keep the final gate voltage of n-channel capacitor 73 near VDD/2+Vtn, when Vin is near VDD. The substrates of n-channel capacitors 70–73, 75–78 are connected to ground, but could be connected to a negative substrate bias such as VBB, or to another voltage, or each to its source.

Figure 10:
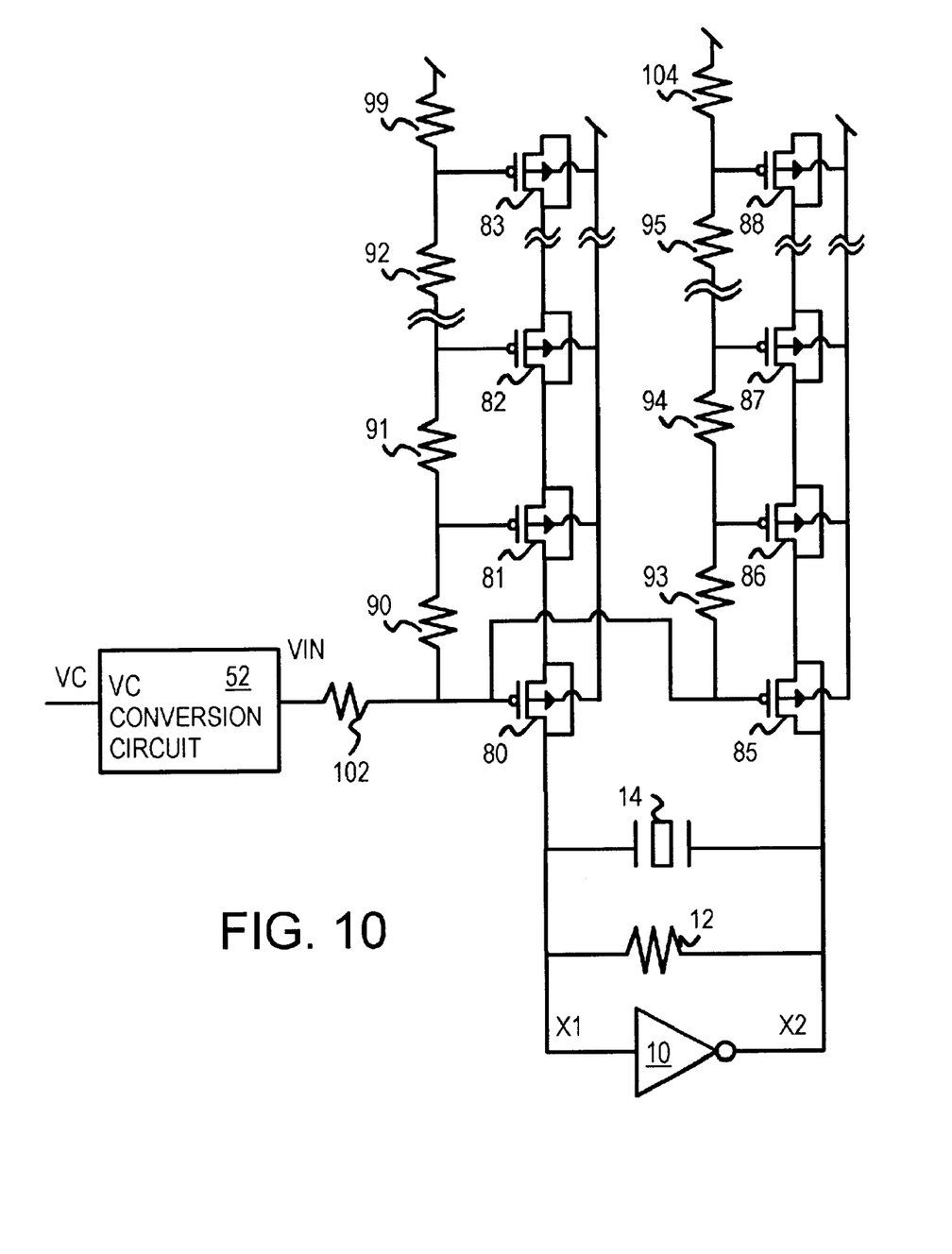
FIG. 10 is a diagram of a VCXO that uses multiple p-channel capacitors in parallel that form channels at different values of the input voltage.

FIG. 10 is a diagram of a VCXO that uses multiple p-channel capacitors in parallel that form channels at different values of the input voltage. Rather than attach just one p-channel capacitor to each node X1, X2, multiple p-channel capacitors are attached. Each p-channel capacitor receives a slightly different gate voltage, so each initially forms a channel at a different time. Thus capacitance changes due to channel turn-on is spread among many values of the input voltage Vin, improving C-V linearity.

Crystal 14 oscillates in response to gain inverter 10 connected across nodes X1, X2. Feedback resistor 12 keeps nodes X1, X2 near VDD/2. The oscillation frequency varies as the load capacitance changes. The load capacitance on node X1 is the sum of parallel capacitances of p-channel capacitors 80–83. The load capacitance on node X2 is the sum of the parallel capacitances of p-channel capacitors 85–88. The number of p-channel capacitors can be increased to improve linearity, or decreased to reduce cost and complexity.

The source and drain nodes of p-channel capacitors 80–83 are connected together and to node X1, so that all p-channel capacitors 80–83 are connected in parallel to node X1. However the gates of p-channel capacitors 80–83 are separate, allowing the gates to be driven by different gate voltages.

Likewise, the source and drain nodes of p-channel capacitors 85–88 are connected together and to node X2, so that all p-channel capacitors 85–88 are connected in parallel to node X2. However the gates of p-channel capacitors 85–88 are separate, allowing the gates to also be driven by different gate voltages. In normal operation, some of p-channel capacitors 80–83 and 85–88 are turned on, having increased capacitance, while others are turned off, having lower capacitance, for a given capacitor size.

Control-voltage conversion circuit 52 converts control voltage Vc to generate input voltage Vin. The range of Vc is 0 to VDD, which is converted to a reduced range of ground to VDD/2 for Vin. Control voltage Vc tunes the oscillation frequency.

Multiple gate voltages are generated from Vin by a series of resistors between Vin and VDD. Input voltage Vin is increased slightly by input resistor 102 to generate the gate voltage for p-channel capacitors 80, 85. The gate voltage is increased further by resistors 90, 93 to produce the somewhat higher gate voltages for p-channel capacitors 81, 86. Resistors 91, 94 further raise the gate voltage to produce still higher gate voltages for p-channel capacitors 82, 87. Other resistors (not shown) drive other gates of p-channel capacitors (not shown) before resistors 92, 95 generate the highest gate voltage, which is applied to the gates of p-channel capacitors. 83, 88.

Each gate is driven with successively higher voltages, but all p-channel capacitors have the same source/drain voltage. Those p-channel capacitors that have gate-to-source voltages exceeding the p-channel transistor threshold voltage (|Vg–Vs|>|Vtp|) have a channel formed and have a higher capacitance. Those p-channel capacitors with absolute gate-to-source voltages under the absolute threshold are turned off and have a lower capacitance of the source and drain junctions but without gate-channel capacitance.

As the input voltage is lowered, each gate voltage falls too, increasing the absolute gate-to-source voltage as the gate voltages are typically below the source voltage of about VDD/2. When a p-channel capacitor has a gate voltage slightly above a threshold below its source, and Vin falls causing the gate voltage to fall below a threshold below the source voltage, the capacitance of that p-channel capacitor increases significantly as the p-type channel forms. However, the capacitance of other p-channel capacitors does not change as significantly, since their channels remain on or off. Thus capacitance changes only slightly as one capacitor turns on at a time.

Head resistors 99, 104 connect the final gates to VDD. Head resistors 99, 104 can have a larger resistance value than other resistors 90, 91, 92, 93, 94, 95, 102 to keep the final gate voltage below the transistor threshold voltage for most values of Vin. For example, resistor 99 can have a large resistance value to keep the final gate voltage of p-channel capacitor 83 near VDD/2–|Vtp|when Vin is near ground.

The substrates of p-channel capacitors 80–83, 85–88 are connected to VDD, but could be connected to other biases, or each to its source.

Figure 11:
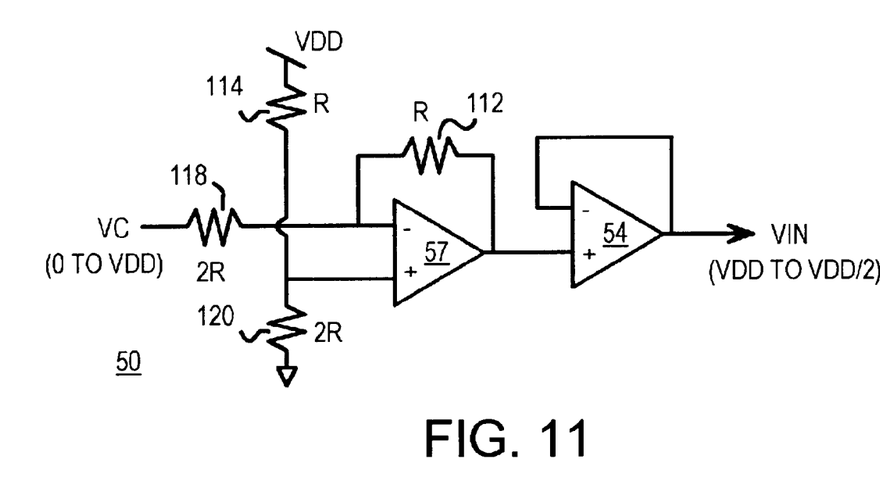
FIG. 11 shows an embodiment of the voltage conversion circuit for driving the gates of distributed n-channel capacitors of FIG. 9.

FIG. 11 shows an embodiment of the voltage conversion circuit for driving the gates of distributed n-channel capacitors of FIG. 9. Control-voltage conversion circuit 50 receives Vc and generates Vin.

Control voltage Vc is applied to the inverting (−) input of op amp 57 through resistor 118. A reference voltage is applied to the non-inverting (+) input of op amp 57. This reference voltage is generated by resistors 114, 120, which act as a voltage divider between power and ground. In this example, pull-up resistor 114 has half the resistance value of pull-down resistor 120, so the reference voltage generated between resistors 114, 120 is ⅔'s of VDD, about 2 volt for a 3-volt VDD.

Feedback resistor 112 is coupled between the output and inverting input of op amp 57. The resistor's value produces an inverter amplifier circuit with a gain (Av) of −½.

As Vc rises above ⅔ VDD, op amp 57 drives its output lower. When Vc is VDD, the output of op amp 57 is Vdd/2. As Vc falls below ⅔ VDD to ground, op amp 57 drives it output higher. When Vc is 0 volt, the output is Vdd. Thus voltage changes to the control voltage Vc are inverted by op amp 57 to generate its output.

The output of op amp 57 is applied to the non-inverting input of op amp 54. The output of op amp 54 is connected to its inverting input, so op amp 54 acts as a unity gain buffer. Op amp 54 buffers the voltage divider of resistors 114, 120 from disturbances in the output voltage Vin that might otherwise be coupled backwards through the circuit. The full swing of Vc from ground to VDD is reduced to the half-range swing of Vin, which ranges from VDD to VDD/2 The output of op amp 54 is input voltage Vin, which is further divided into multiple gate voltages to drive the multiple n-channel capacitors. When Vc swings from ground to VDD, Vin swings in reverse from VDD to VDD/2. The n-channel capacitors are driven with the upper half of the full voltage range (VDD to VDD/2), since the n-channel capacitors are turned off for the lower half of the range as their sources are near VDD/2.

Figure 12:
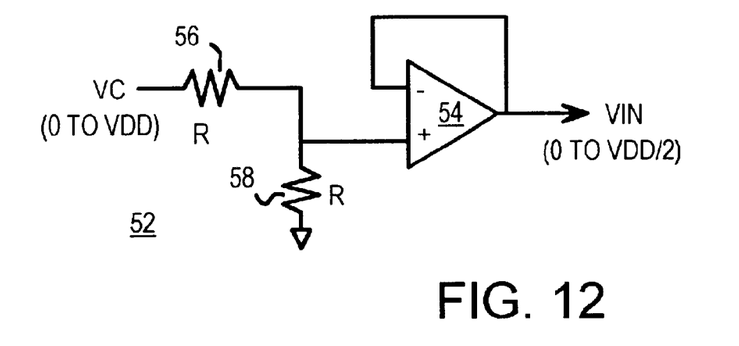
FIG. 12 shows an embodiment of the voltage conversion circuit for driving the gates of distributed p-channel capacitors of FIG. 10.

FIG. 12 shows an embodiment of the voltage conversion circuit for driving the gates of distributed p-channel capacitors of FIG. 10. Control-voltage conversion circuit 52 receives Vc and generates Vin. Resistors 56, 58 between Vc and ground form a voltage divider. Resistors 56, 58 have a same resistance value R. The node between resistors 56, 58 has half the voltage of Vc, and is applied to the non-inverting input of op amp 54. The output of op amp 54 is connected to its inverting input, so op amp 54 acts as a unity gain buffer. Op amp 54 buffers the voltage divider from disturbances in the output voltage Vin that might otherwise be coupled backwards through the circuit.

The output of op amp 54 is input voltage Vin, which is further divided into multiple gate voltages to drive the multiple p-channel capacitors. When Vc swings from ground to VDD, Vin swings from ground to VDD/2. The p-channel capacitors are driven with the lower half of the full voltage range, since the p-channel capacitors are turned off for the upper half of the range as their sources are near VDD/2.

ALTERNATE EMBODIMENTS

Several other embodiments are contemplated by the inventors. For example different numbers of p-channel or n-channel capacitors could be used in parallel. The capacitors do not have to have separate source and drain regions, but could have one combined source/drain region. The standard transistor layout does not have to be used for the capacitors, but other layouts such as doughnut rings or large rectangles with source/drain on 3 sides could be employed.

The voltage range generated by the conversion circuit could be adjusted or shifted. A single resistor ladder could be used for generating gate voltages for capacitors of both nodes X1, X2, rather than separate ladders as shown. The sizes of the n-channel capacitors can vary, as can the values of the resistors in the ladders. This allows the shape of the capacitance-voltage curve to be more precisely designed to straighten the frequency vs. Vc curve.

The crystal nodes X1, X2 could each have both n-channel and p-channel capacitors connected in parallel. Two voltage conversion circuits could be used in parallel to generate gate voltages for the n-channel and p-channel capacitors. The input voltage can be the voltage on the first capacitor gate or output by the conversion circuit but separated from the first capacitor gate by a resistor.

The tail resistor could terminate at a voltage other than ground, and the tail resistor could be eliminated. The same is true for the head resistors, which could be terminated at a voltage other than the power-supply voltage or could be deleted and the highest gate voltage set to some fixed voltage. The gain inverter could be replaced with an equivalent, such as an op amp or other inverting amplifier. A standard buffer or a pair of inverters could be used for the unity gain buffer in the voltage conversion circuits.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals, such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A Voltage-controlled crystal oscillator (VCXO) comprising:
    a crystal, coupled between a first node and a second, that oscillates at an oscillation frequency when connected to a gain inverter;
    the gain inverter having an input driven by the first node, for driving the second node to induce oscillation by the crystal;
    a feedback resistor coupled between the first and second nodes;
    a first metal-oxide-semiconductor (MOS) capacitor, having a source/drain coupled to the first node, and a gate coupled to a first gate node, the first MOS capacitor having a capacitance that varies with a first input voltage of the first gate node; and
    a second MOS capacitor, having a source/drain coupled to the second node, and a gate coupled to a second gate node, the second MOS capacitor having a capacitance that varies with a second input voltage of the second gate node;

wherein the first and second gate nodes are connected together and driven by an input voltage, wherein the oscillation frequency and capacitances of the first and a controlled input for a control voltage that can vary from a ground to a power-supply VDD voltage, the control voltage causing the oscillation frequency increases when the control voltage rises, but causing the oscillation frequency decreases when the control voltage falls;

voltage conversion circuit means, receiving the control voltage, for generating the input voltage, and for limiting the input voltage to only half of a range of the control voltage;

wherein the first and second MOS capacitors are n-channel capacitors;

wherein the input voltage falls from VDD/2 when the control voltage rises from ground to VDD;

wherein the intermediate voltage of the first and second nodes is VDD 2;

wherein the voltage conversion circuit means comprises:
op amp means, having an inverting and a non-inverting input, for generating the input voltage on an output;
an input resistor between the control voltage input and the inverting input to the op amp means;
voltage divider means for generating a reference voltage applied to the non-inverting input of the op amp means;
a feedback resistor between the output and the inverting input of the op amp means;
an output resistor between the output of the op amp means and the first gate node, whereby the first and second MOS capacitors are driven by the input voltage that is at or above a source/drain voltage to bias the first and second MOS transistors in an on region of operation for most of a range of the control voltage and whereby a full-swing control voltage is converted to a half-swing input voltage to gates of the first and second MOS capacitors and whereby variations in the input voltage vary the oscillation frequency by adjusting capacitances of the first and second MOS capacitors and whereby changes to the control voltages are inverted and halved by the voltage conversion circuit means to generate the input voltage.

2. The VCXO of claim 1 further comprising:
a first parallel MOS capacitor, having a source/drain node connected to the first node, and a gate coupled to a first parallel gate node, the first parallel MOS capacitor having a capacitance that varies with a first parallel input voltage of the first parallel gate node;
wherein the first MOS capacitor is a third parallel MOS capacitor, having a source/drain node connected to the first node, and a gate coupled to the first gate node, the first MOS capacitor having a capacitance that varies with the first input voltage of the first gate node;
a first series resistor, coupled between the first gate node and the first parallel gate node, for generating a voltage difference between the first input voltage and the first parallel input voltage;
a second parallel MOS capacitor, having a source/drain node connected to the second node, and a gate coupled to a second parallel gate node, the second parallel MOS capacitor having a capacitance that varies with a second parallel input voltage of the second parallel gate node;
wherein the second MOS capacitor is a fourth parallel MOS capacitor, having a source/drain node connected to the second node, and a gate coupled to the second gate node, the second MOS capacitor having a capacitance that varies with the second input voltage of the second gate node; and a second series resistor, coupled between the second gate node and the second parallel gate node, for generating a voltage difference between the second input voltage and the second parallel input voltage, whereby MOS capacitors are in parallel to the first and second nodes, but have different gate voltages applied.

3. The VCXO of claim 2 wherein the voltage conversion circuit means further comprises:
buffer means, coupled to the output of the op amp means, for buffering the output from the input voltage.

4. An integrated oscillator circuit comprising on a single substrate:
a first node for connecting to a first terminal of an external crystal;
a second node for connecting to a second terminal of the external crystal;
an inverter, coupled between the first and second node, for activating the external crystal to oscillate at an oscillation frequency;
a feedback resistor, coupled between the first and second nodes, to bias the first and second nodes to a voltage near VDD/2, where VDD is a power-supply voltage;
a first n-channel capacitor, having a source/drain node connected to the first node, and a gate coupled to a first gate node;
a second n-channel capacitor, having a source/drain node connected to the second node, and a gate coupled to a second gate node;
a voltage conversion circuit, receiving a control voltage, for generating an input voltage applied to the first and second gate nodes;
wherein load capacitance on the first and second nodes varies as capacitance of the first and second n-channel capacitors changes as a n-type channel forms under the gate as the input voltage rises more than a threshold voltage above VDD/2;
a plurality of resistors in series between the input voltage and a fixed voltage, for generating a plurality of gate voltages between the input voltage and the fixed voltage, the gate voltages differing from one another;
a first plurality of n-channel capacitors each having source/drain nodes coupled to the first node but each having separate gate nodes that receive the plurality of gate voltages; and
a second plurality of n-channel capacitors each having source/drain nodes coupled to the second node but each having separate gate nodes that receive the plurality of gate voltages,
whereby load capacitance on the first node increases as the input voltage increases and one of the first plurality of n-channel capacitors forms a new n-type channel under its gate and whereby the oscillation frequency is varied by the control voltage that varies the input voltage and capacitance of the first and second n-channel capacitors.

5. The integrated oscillator circuit of claim 4 wherein the plurality of resistors further comprises:
a first plurality of resistors in a first series between the input voltage and the fixed voltage, for generating a first plurality of gate voltages between the input voltage and the fixed voltage, the gate voltages differing from one another;

wherein the first plurality of gate voltages are applied to gates of the first plurality of n-channel capacitors;

second plurality of resistors in a second series between the input voltage and the fixed voltage, for generating a second plurality of gate voltages between the input voltage and the fixed voltage, the gate voltages differing from one another;

wherein the second plurality of gate voltages are applied to gates of the second plurality of n-channel capacitors.

6. The integrated oscillator circuit of claim 5 wherein the fixed voltage is a ground;

wherein the first plurality of resistors includes a first tail resistor between the ground and a last gate of a last n-channel capacitor to turn on, and wherein the second plurality of resistors includes a second tail resistor between the ground and a last gate of a last n-channel capacitor to turn on.

7. The integrated oscillator circuit of claim 4 wherein the voltage conversion circuit comprises:

an op amp, having an inverting and a non-inverting input, for generating the input voltage on an output;

an input resistor between the control voltage input and the inverting input to the op amp;

a voltage divider for generating a reference voltage applied to the non-invering input of the op amp;

a feedback resistor between the output and the inverting input of the op amp;

an output resistor between the output of the op amp and the first gate node, whereby changes to the control voltage are inverted and halved by the voltage conversion circuit means to generate the input voltage.

8. The integrated oscillator circuit of claim 7 wherein the voltage divider comprises:

a pull-up resistor between the reference voltage an the power-supply voltage;

a pull-down resistor between the reference voltage an a ground;

wherein the pull-down resistor has substantially twice a resistance of the pull-up resistor.

9. The integrated oscillator circuit of claim 7 wherein the voltage conversion circuit further comprises:

a buffering op amp, receiving the output of the op amp at a non-inverting input, and having its output generate the input voltage which is applied to an inverting input of the buffering op amp, whereby the input voltage is buffered from the control voltage.

10. The integrated oscillator circuit of claim 4 wherein substrates of n-channel capacitors are all connected to a ground or to a substrate bias voltage below the ground.

11. An integrated voltage-controlled crystal oscillator (VCXO) control circuit comprising:

a first node for connecting to a first node of an external crystal;

a second node for connecting to a second node of the external crystal;

a gain inverter between the first and second node for driving the external crystal;

a feedback resistor between the first and second node;

a first lowest p-channel capacitor formed from a p-channel transistor having a source and a drain coupled to the first node, and a gate driven by a lowest gate node, wherein capacitance of the first lowest p-channel capacitor increases substantially when a p-type channel is formed under the gate when the lowest gate node is more than a threshold below a voltage of the first node;

a second lowest p-channel capacitor formed from a p-channel transistor having a source and a drain coupled to the second node, and a gate driven by the lowest gate node, wherein capacitance of the second lowest p-channel capacitor increases substantially when a p-type channel is formed under the gate when the lowest gate node is more than the threshold below a voltage of the second node;

a first middle p-channel capacitor formed from a p-channel transistor having a source and a drain coupled to the first node, and a gate driven by a middle gate node, wherein capacitance of the first middle p-channel capacitor increases substantially when a p-type channel is formed under the gate when the middle gate node is more than a threshold below a voltage of the first node;

a second middle p-channel capacitor formed from a p-channel transistor having a source and a drain coupled to the second node, and a gate driven by the middle gate node, wherein capacitance of the second middle p-channel capacitor increases substantially when a p-type channel is formed under the gate when the middle gate node is more than the threshold below a voltage of the second node;

a first upper p-channel capacitor formed from a p-channel transistor having a source and a drain coupled to the first node, and a gate driven by a upper gate node, wherein capacitance of the first upper p-channel capacitor increases substantially when a p-type channel is formed under the gate when the upper gate node is more than a threshold below a voltage of the first node;

a second upper p-channel capacitor formed from a p-channel transistor having a source and a drain coupled to the second node, and a gate driven by the upper gate node, wherein capacitance of the second upper p-channel capacitor increases substantially when a p-type channel is formed under the gate when the upper gate node is more than the threshold below a voltage of the second node;

a lowest resistor, coupled between the lowest gate node and the middle gate node; and a middle resistor, coupled between the middle gate node and the upper gate node.

12. The integrated VCXO control circuit of claim 11 further comprising:

an upper resistor, coupled between the upper gate node and an upper control voltage; and an input resistor, coupled between a lower control voltage and the lowest gate node, whereby gates of channel capacitors are driven by a range of voltages generated between the upper control voltage and the lower control voltage.

13. The integrated VCXO control circuit of claim 12 wherein the upper control voltage is a fixed power-supply voltage;

wherein the lower control voltage is an input voltage that is varied to adjust oscillation frequency.

14. The integrated VCXO control circuit of claim 13 wherein substrate terminals of the p-channel capacitors are coupled to the fixed power-supply voltage.

15. The integrated VCXO control circuit of claim 12 wherein the input voltage is generated from a control voltage by a voltage conversion circuit that comprises:
- a first resistor between the control voltage and an intermediate node;
- a second resistor between the intermediate node and a ground;
- a buffer that buffers the intermediate node to generate the lower control voltage.

16. The integrated VCXO control circuit of claim 15 wherein the voltage conversion circuit further comprises:
- a buffering op amp having a non-inverting input coupled to the intermediate node and an inverting input coupled to an output of the buffering op amp that drives the lower control voltage to the input resistor.

* * * * *